United States Patent
Kumar et al.

(10) Patent No.: US 8,453,322 B2
(45) Date of Patent: Jun. 4, 2013

(54) MANUFACTURING METHODS OF MULTILAYER PRINTED CIRCUIT BOARD HAVING STACKED VIA

(75) Inventors: Raj Kumar, Mission Viejo, CA (US); Monte Dreyer, Rancho Santa Margarita, CA (US); Michael J. Taylor, Longmont, CO (US); Ruben Zepeda, Yorba Linda, CA (US)

(73) Assignee: DDi Global Corp., St. Louis, MO (US)

( * ) Notice: Subject to any disclaimer, the term of this patent is extended or adjusted under 35 U.S.C. 154(b) by 816 days.

(21) Appl. No.: 12/539,172

(22) Filed: Aug. 11, 2009

(65) Prior Publication Data
US 2010/0038125 A1     Feb. 18, 2010

Related U.S. Application Data
(60) Provisional application No. 61/189,171, filed on Aug. 14, 2008.

(51) Int. Cl.
*H01K 3/10*     (2006.01)

(52) U.S. Cl.
USPC ............. 29/852; 29/831; 29/847; 174/262

(58) Field of Classification Search
USPC .... 29/830, 831, 846, 847, 852, 853; 174/255, 174/262, 264
See application file for complete search history.

(56) References Cited

U.S. PATENT DOCUMENTS

| | | | |
|---|---|---|---|
| 6,408,511 B1 * | 6/2002 | Branchevsky | 29/852 |
| 7,155,821 B1 | 1/2007 | Downes et al. | |
| 7,523,545 B2 | 4/2009 | Kumar et al. | |
| 7,737,367 B2 * | 6/2010 | Koyama et al. | 174/264 |
| 8,156,645 B2 | 4/2012 | Sidhu | |
| 2007/0246254 A1 | 10/2007 | Kumar et al. | |

OTHER PUBLICATIONS
International Search Report and Written Opinion dated Oct. 6, 2009 for Application No. PCT/US09/53783.
International Preliminary Report on Patentability, dated Feb. 24, 2011, for Application No. PCT/US2009/053783, 7 pages.

* cited by examiner

*Primary Examiner* — Donghai D. Nguyen
(74) *Attorney, Agent, or Firm* — Polsinelli PC

(57) ABSTRACT

Methods of manufacturing at least a portion of a printed circuit board. The circuit board is formed to include a plurality of sub-assemblies, each of the sub-assemblies including a plurality of circuit layers and having at least one countersink and at least one hole, the countersink having a first diameter and a first depth from a first side of at least one of the sub-assemblies and into the at least one sub-assembly, the hole having a second diameter smaller than the first diameter and a second depth longer than the first depth from the first side of the at least one sub-assembly and into the at least one sub-assembly at the countersink; a metal metalized within the hole and the countersink; a lamination adhesive interposed between one and a corresponding one of the sub-assemblies and having at least one via formed therethrough; and a counter paste filled within the via.

17 Claims, 7 Drawing Sheets

MANUFACTURING METHODS OF MULTILAYER PRINTED CIRCUIT BOARD HAVING STACKED VIA

CROSS-REFERENCE TO RELATED APPLICATION(S)

This application claims priority to and the benefit of U.S. Provisional Application No. 61/189,171, filed on Aug. 14, 2008, the entire content of which is incorporated herein by reference.

BACKGROUND OF THE INVENTION

1. Field of the Invention

The present invention relates generally to printed circuit (wiring) boards and methods of manufacturing the same, and more particularly, to a multilayer printed circuit board with additional functionality and a method of manufacturing the same.

2. Description of the Related Art

Most electronic systems include printed circuit boards with high density electronic interconnections. A printed circuit board may include one or more circuit cores, substrates, or carriers. In one fabrication scheme for the printed circuit board having the one or more circuit carriers, electronic circuitries (e.g., pads, electronic interconnects, etc.) are fabricated onto opposite sides of an individual circuit carrier to form a pair of circuit layers. These circuit layer pairs of the circuit board may then be physically and electronically joined to form the printed circuit board by fabricating an adhesive (or a prepreg or a bond ply), stacking the circuit layer pairs and the adhesives in a press, curing the resulting circuit board structure, drilling or laser drilling through-holes, and then plating the through-holes with a copper material to interconnect the circuit layer pairs. The curing process is used to cure the adhesives to provide for permanent physical bonding of the circuit board structure. However, the adhesives generally shrink significantly during the curing process. The shrinkage combined with the later through-hole drilling and plating processes can cause considerable stress into the overall structure, leading to damage or unreliable interconnection or bonding between the circuit layers during assembly and/or other thermal excursions. Thus, there is a need for material and associated processes which can compensate for this shrinkage and can provide for stress-free and reliable electronic interconnection between the circuit layer pairs.

In addition, the plating of the through-holes (or vias) with the copper material requires an additional, expensive, and time consuming process sequence that is difficult to implement with a quick turnaround. Thus, there is a need to provide for a printed circuit board and a method of manufacturing the same that can be quickly and easily assembled and/or ensure alignment of the interconnections (or through-holes or micro vias) on the printed circuit board during the assembly process to thereby reduce assembly costs. Further, there is a need to provide a multilayer printed circuit board with additional functionality and a method of manufacturing the same.

SUMMARY OF THE INVENTION

Aspects of embodiments of the present invention are directed toward enhancements of stacked microvias laminated printed circuit boards formed in one or two lamination cycles, by parallel process, and/or that can have carrier-to-carrier, sub-to-sub (sub-assembly to sub-assembly) attachments with conductive vias, each filled with a conductive material (e.g., with a conductive paste) in the Z-axis.

An embodiment of the present invention provides a method of manufacturing at least a portion of a printed circuit board. The method includes attaching a plurality of sub-assemblies with each other after processing at least one of the plurality of sub-assemblies. Here, each of the plurality of sub-assemblies includes a plurality of circuit layers, and the processing of the at least one of the plurality of sub-assemblies includes: forming at least one hole having a first diameter and a first depth from a first side of the at least one of the plurality of sub-assemblies and into the at least one of the plurality of sub-assemblies; forming at least one countersink having a second diameter larger than the first diameter and a second depth shorter than the first depth from the first side of the at least one of the plurality of sub-assemblies and into the at least one of the plurality of sub-assemblies at the at least one hole; metalizing the at least one hole and the at least one countersink to metalize the at least one hole and the at least one countersink; applying a lamination adhesive on the first side of the at least one of the plurality of sub-assemblies; applying a protective film on the lamination adhesive; forming at least one via into the lamination adhesive to expose a metalized portion of the at least one countersink; filling at least one conductive paste into the at least one via formed in the lamination adhesive; and removing the protective film to expose the lamination adhesive on the at least one of the plurality of sub-assemblies for attachment with the other plurality of sub-assemblies.

In one embodiment, the metalizing of the at least one hole and the at least one countersink includes electrolytic plating the at least one hole and the at least one countersink to plate close the at least one hole and the at least one countersink. The electrolytic plating of the at least one hole and the at least one countersink may include electrolytic copper plating the at least one hole and the at least one countersink to plate close the at least one hole and the at least one countersink with copper.

In one embodiment, the attaching of the plurality of sub-assemblies includes: aligning the plurality of sub-assemblies to each other; and curing the lamination adhesive on the at least one of the plurality of sub-assemblies to laminate the plurality of sub-assemblies with each other.

In one embodiment, the at least one of the plurality of sub-assemblies includes a substrate, at least one foil pad on the substrate, and a prepreg on the substrate and covering the at least one foil pad, wherein the forming of the at least one hole includes drilling the at least one hole to correspond in position to the at least one foil pad, and wherein the forming of the at least one countersink includes drilling the at least one countersink to correspond in position to the at least one foil pad. In one embodiment, the drilling of the at least one hole includes drilling the at least one hole entirely through both the prepreg and the at least one foil pad, and the drilling of the at least one countersink includes drilling the at least one countersink at least partially though the prepreg and only partially though the at least one foil pad. In one embodiment, the drilling of the at least one hole includes drilling the at least one hole at least partially through the prepreg, the at least one foil pad and the substrate, and the drilling of the at least one countersink includes drilling the at least one countersink at least partially though the prepreg.

In one embodiment, prior to drilling of the at least one hole, the method further includes: laminating a solid metal foil layer on the first side of the at least one of the plurality of sub-assemblies as an outermost layer of the at least one of the plurality of sub-assemblies; and selectively removing a portion of the solid metal foil layer to form a clearance at a position corresponding to the at least one hole and the at least one countersink. The forming of the at least one hole may include drilling the at least one hole at the clearance, and the forming of the at least one countersink may include drilling the at least one countersink at the clearance. The selectively removing of the portion of the solid metal foil layer to form the clearance may include selectively removing of the portion of the solid metal foil layer to form the clearance to have a third diameter substantially identical to the second diameter.

In one embodiment, the method further includes: forming at least another hole having substantially the first diameter and the first depth from a second side of the at least another one of the plurality of sub-assemblies and into the at least another one of the plurality of sub-assemblies; forming at least another countersink having substantially the second diameter and the second depth from the second side of the at least another one of the plurality of sub-assemblies and into the at least another one of the plurality of sub-assemblies at the at least another hole; and metalizing the at least another hole and the at least another countersink to metalize the at least another hole and the at least another countersink. The attaching of the plurality of sub-assemblies may include: aligning the at least one countersink and the at least another countersink to face and be electrically coupled to each other through the at least one via filled with the conductive paste; and curing the lamination adhesive on the at least one of the plurality of sub-assemblies to laminate the at least one of the plurality of sub-assemblies to the at least another one of the plurality of sub-assemblies.

In one embodiment, the first diameter is about 6 mils, and the second diameter is about 10 mils.

In one embodiment, the at least one countersink is formed by laser drilling, and the at least one hole is formed by mechanical drilling. The at least one via may be formed by laser drilling.

In one embodiment, the at least one countersink is formed by drilling, the at least one hole is formed by drilling, and the at least one via is formed by drilling.

Another embodiment of the present invention provides a method of manufacturing at least a portion of a printed circuit board. The method includes attaching a plurality of sub-assemblies with each other after processing at least one of the plurality of sub-assemblies. Here, each of the plurality of sub-assemblies comprises a plurality of circuit layers and the processing of the at least one of the plurality of sub-assemblies includes: forming at least one countersink having a first diameter and a first depth from a first side of the at least one of the plurality of sub-assemblies and into the at least one of the plurality of sub-assemblies; forming at least one hole having a second diameter smaller than the first diameter and a second depth longer than the first depth from the first side of the at least one of the plurality of sub-assemblies and into the at least one of the plurality of sub-assemblies at the at least one countersink; metalizing the at least one hole and the at least one countersink to metalize the at least one hole and the at least one countersink; applying a lamination adhesive on the first side of the at least one of the plurality of sub-assemblies; applying a protective film on the lamination adhesive; forming at least one via into the lamination adhesive to expose a metalized portion of the at least one countersink; filling at least one conductive paste into the at least one via formed in the lamination adhesive; and removing the protective film to expose the lamination adhesive on the at least one of the plurality of sub-assemblies for attachment with the other plurality of sub-assemblies.

Another embodiment of the present invention provides a printed circuit board that includes a plurality of sub-assemblies, each of the plurality of sub-assemblies including a plurality of circuit layers and having at least one countersink and at least one hole, the at least one countersink having a first diameter and a first depth from a first side of the at least one of the plurality of sub-assemblies and into the at least one of the plurality of sub-assemblies, the at least one hole having a second diameter smaller than the first diameter and a second depth longer than the first depth from the first side of the at least one of the plurality of sub-assemblies and into the at least one of the plurality of sub-assemblies at the at least one countersink; a metal metalized within the at least one hole and the at least one countersink; a plurality of lamination adhesives, each of the plurality of lamination adhesives being interposed between one and a corresponding one of the plurality of sub-assemblies and having at least one via formed therethrough; and a counter paste filled within the at least one via, wherein the plurality of sub-assemblies are electrically coupled with each other through the at least one micro via of each of the plurality of lamination adhesives and the at least one countersink and the at least one hole of each of the plurality of sub-assemblies.

In one embodiment, the metal in the at least one hole is securely anchored with the at least one hole by the metal in the at least one countersink.

In one embodiment, the at least one countersink is configured to face and increase a contact surface area with at least another counter sink of at least another one of the plurality of sub-assemblies.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1A:
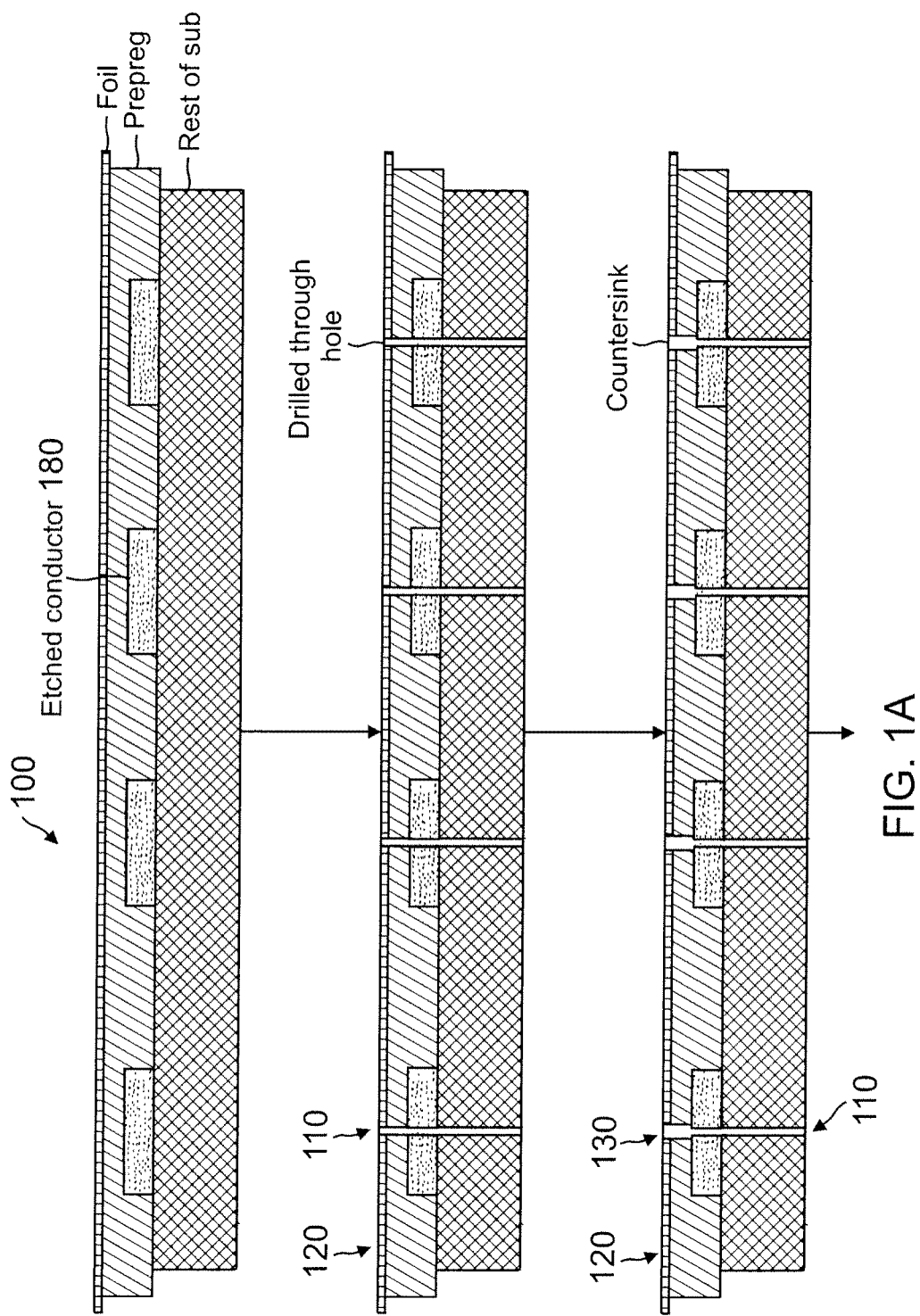
FIGS. 1A, 1B and 1C illustrate a detail process for allowing a sub-assembly (sub) to be prepared according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive.

Also, in the context of the present application, when an element is referred to as being "on" another element, it can be directly on the another element or be indirectly on the another element with one or more intervening elements interposed therebetween. Like reference numerals designate like elements throughout the specification.

As envisioned, embodiments of the present invention provide a multilayer printed circuit board with additional functionality and a method of manufacturing the same.

In more detail, stacked micro vias produced by parallel build or laminating single sided laminates has been demonstrated and is the subject of U.S. Pat. No. 7,523,545, filed on Feb. 14, 2007, which is assigned to the same assignee as the present invention and is incorporated by reference herein in its entirety. Here, in one embodiment, a single sided laminate has adhesive applied, vias are laser generated thru the adhesive and filled with ink. The various layers are made in parallel and brought together in layup for lamination. The second side foil is imaged and etched in a print and etch. These layers can be individually tested prior to layup and lamination.

Conventional sequential lamination often requires lamination of sub-assemblies (subs) before a second lamination attaches the first sub to the second sub. This sub to sub attach can be accomplished in the same manner as multiple single sided materials. It is possible to build very high aspect ratio conductive paths though PCB for applications such as probe cards if two or more subs are attached in this way. Conventional sequential build also can start from the middle out with structures like 3+N+3 (3 sub+N sub+3 sub) that add outer layers facing away from the center. A similar strategy could be made with the single stack approach.

U.S. Pat. No. 7,523,545 as referenced above addresses adhesive thickness and copper thickness. Here, the present inventive entity has found that laminating a piece of prepreg to the thicker copper will allow encapsulated conductors and a flat surface to practice the stacking of single layer cores by making a sub with the prepreg encapsulated heavy copper.

The present inventive entity has also found that more material types than FR4 and GPY materials can be used in the single layer parallel build process.

Mass via processes using plasma (Diconex) and chemical milling may be suitable for producing the vias, particularly on thinner constructions, thinner layers needing to be milled.

In more detail, the additional functionalities for parallel build techniques (parallel build) according to embodiments of the present invention are as follows:

1. Incorporate 2 metal layer sub structures into the parallel build
    a. Single sided inked cores can be applied upside down on one side of the 2 metal layer sub while on the opposite side, the single sided core is applied in the opposite orientation during layup.
    b. Subs can be made from one core or multiple cores held together by prepreg or combinations with adhesive.
    c. Subs can have plated thru holes, they may be filled with conductive or non conductive viafill.
    d. Subs can be a hybrid of parallel build single layer, two layer composites.
2. Incorporate 1 metal layer substructure into the parallel build
    a. Subs can be made from one core or multiple cores held together by prepreg or combinations with adhesive.
    b. Subs can have plated thru holes, they may be filled with conductive or non conductive viafill.
    c. Subs can be a hybrid of parallel build single layer, two layer composites.
    d. Subs can use a conventional printed through hole (PTH) or a metal (or copper) wrap with countersink as described in more detail below printed through hole (PTH).
3. Incorporate prepreg against thick copper to facilitate making a flat single sided sub.
4. Expand the list of allowable materials to include all of the materials currently used to build PCB.
5. Expand the list of release materials allowable to include release coated paper.
6. Vias could be made with plasma or chemical milling or other suitable methods of making the vias.

Exemplary embodiments of the present invention will now be described more fully hereinafter with reference to the accompanying drawings. As those skilled in the art would realize, the described embodiments may be modified in various suitable ways, without departing from the sprit or scope of the present invention.

Figure 1B:
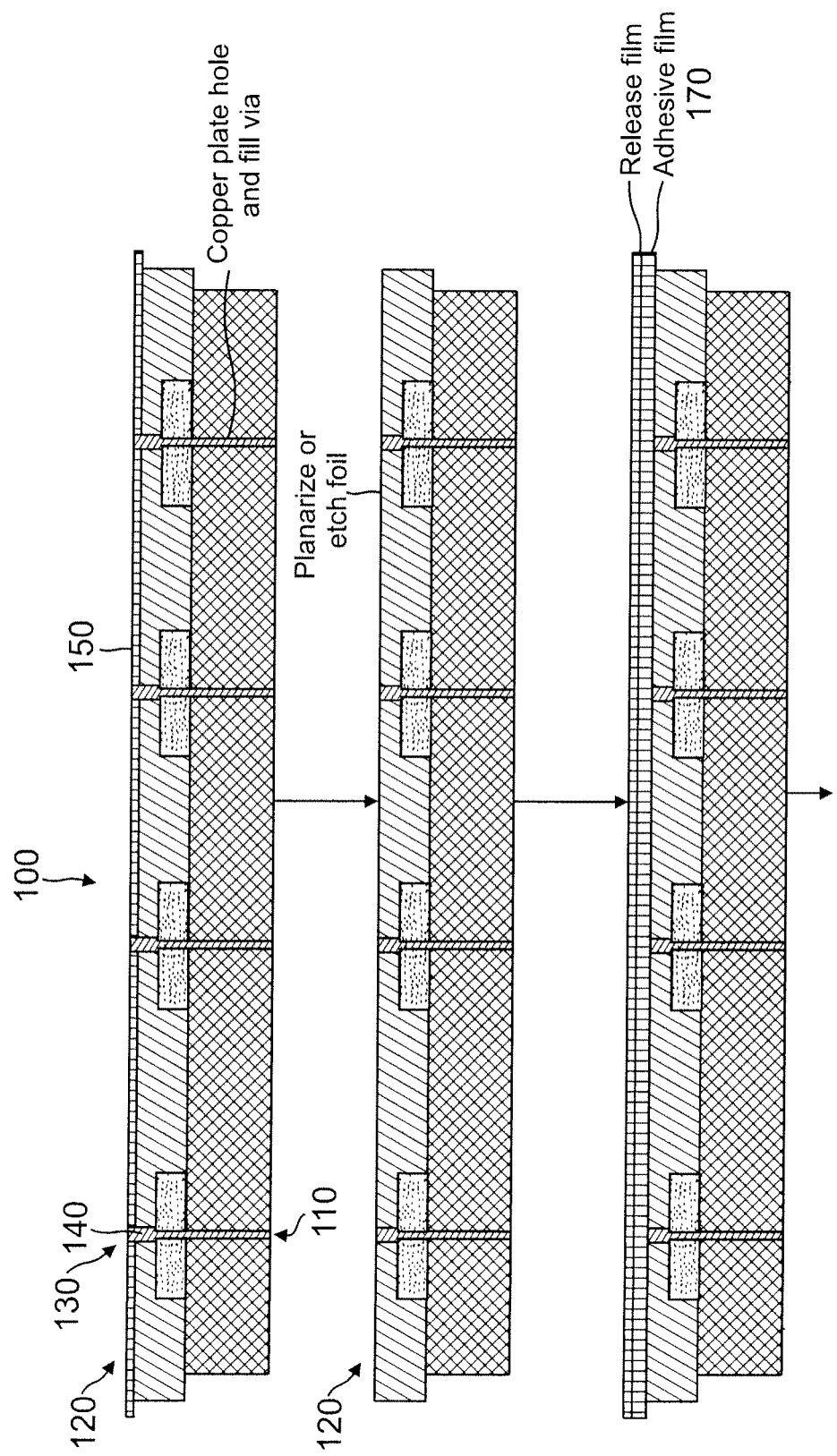
Figure 1C:
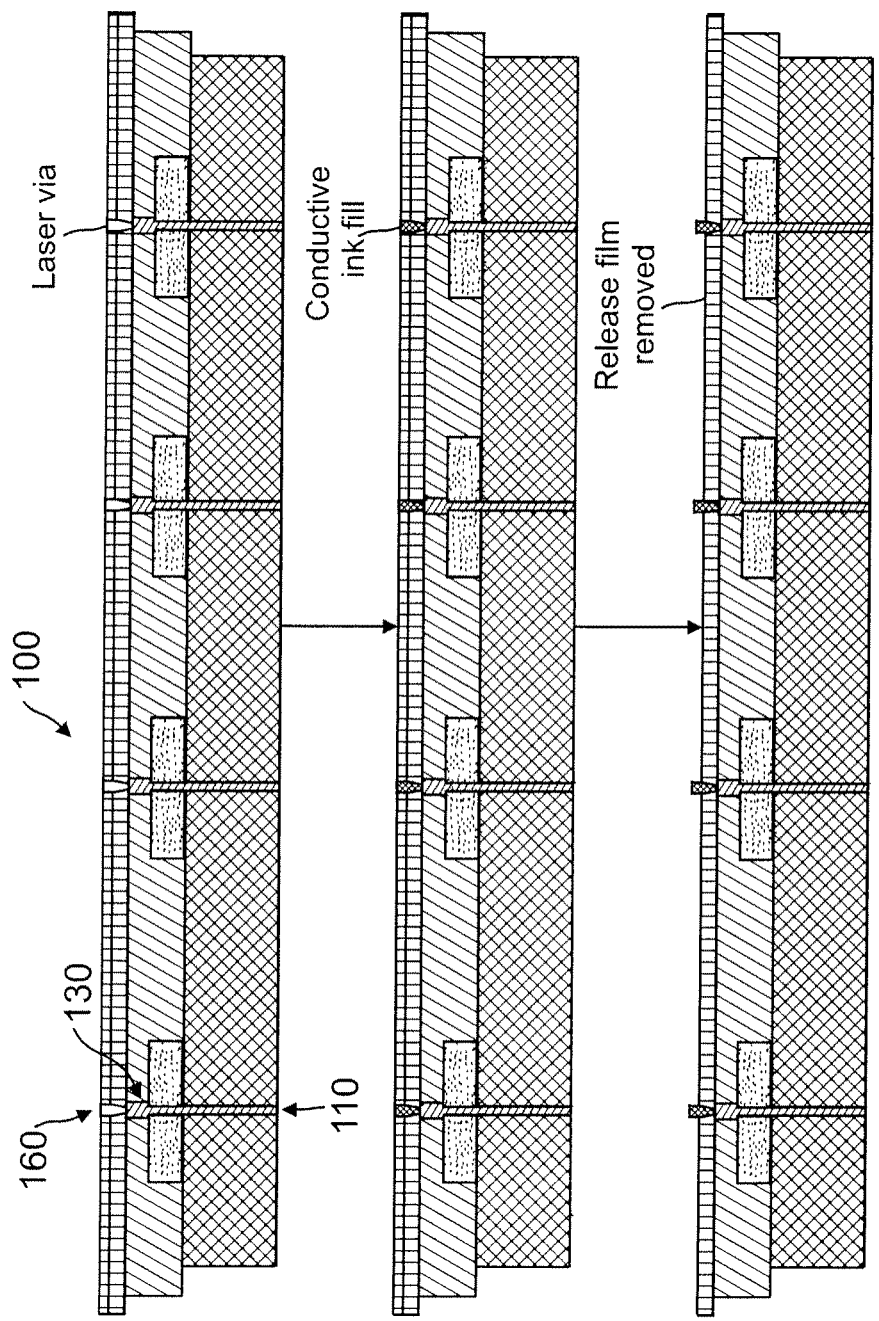

FIGS. 1A, 1B and 1C illustrate a detail for allowing a sub to be prepared for a process. Here, the sub is made relatively "flat" to facilitate assembly of several substructures. A related technique for making relatively flat circuit board or subcomponent of the circuit board is described in co-pending U.S. patent application Ser. No. 12/157,021, filed on Jun. 5, 2008, which is assigned to the same assignee as the present invention and is incorporated by reference herein in its entirety.

In more detail, a method of manufacturing at least a portion of a printed circuit board using a lamination process sequence for attaching a plurality of sub-assemblies with each other according to an exemplary embodiment of the present invention will be described with reference to FIGS. 1A, 1B and 1C.

As shown in FIG. 1A, a first sub-assembly 100 is processed. The first sub-assembly 100 includes a plurality of circuit layers. Here, in FIG. 1A, one or more holes 110, each having a first diameter and a first depth is formed from a first side 120 of the first sub-assembly 100. Here, the holes 110 are formed by mechanical drilling but, the present invention is not thereby limited. In addition, as shown in FIG. 1A, one or more countersinks 130, each having a second diameter larger than the first diameter and a second depth shorter than the first depth from the first side 120 of the first sub-assembly 100, are formed. In one embodiment, the first diameter is about 6 mils, and the second diameter is about 10 mils. Here, as also shown in FIG. 1A, one countersink 130 is formed at a position that corresponds to one corresponding hole 110. In addition, although it is shown in FIG. 1A that the countersinks 130 are formed after the holes 100 were formed, the present invention is not thereby limited. That is, in another embodiment of the present invention, the countersinks 130 can be formed before the holes 100 are formed.

In FIG. 1B, the holes 110 and the countersink 130 are metalized with a metal material 140. Here, in one embodiment, the holes 110 and the countersinks 130 are metalized by electrolytic plating the holes 110 and the countersinks 130 to plate close the holes 110 and the countersinks 130. The electrolytic plating of the holes 110 and the countersinks 130 may include electrolytic copper plating the holes 110 and the countersinks 130 to plate close the holes and the countersinks with copper.

Also, as shown in FIG. 1B, a solid metal foil layer 150 that was previously laminated on the first side 120 of the first sub-assembly 100 as the outermost layer of the first sub-assembly is etched or planarized off the first side 120 of the first sub-assembly 100. A lamination adhesive (Adhesive film) 170 is then applied onto the first side 120 of the first sub-assembly 100. A protective film (Release film) is then applied onto the lamination adhesive.

Here, the protective film (or Mylar sheet) is shown to be attached to the sub-assembly with the lamination adhesive (or prepreg or bond ply) 170 interposed between the protective film and the first sub-assembly 100. The protective film of the present invention, however, is not limited to only Mylar sheet, and can be made of any suitable material, such as polyester, oriented polypropylene, polyvinylfluoride, polyethylene, high density polyethylene, polyethylene napthalate, pacothane, polymethylpentene, or combinations thereof. Also, in FIG. 1C, one or more vias 160 are formed in the lamination adhesive 170 and at positions respectively corresponding to the countersinks 130 and the holes 110. Here, in FIG. 1C, the via (or micro via) 160 is formed by laser drilling. However, the present invention is not thereby limited.

Also, as shown In FIG. 1C, a conductive paste (Conductive ink) is filled into the via 160 formed in the lamination adhesive 170.

Figure 2:
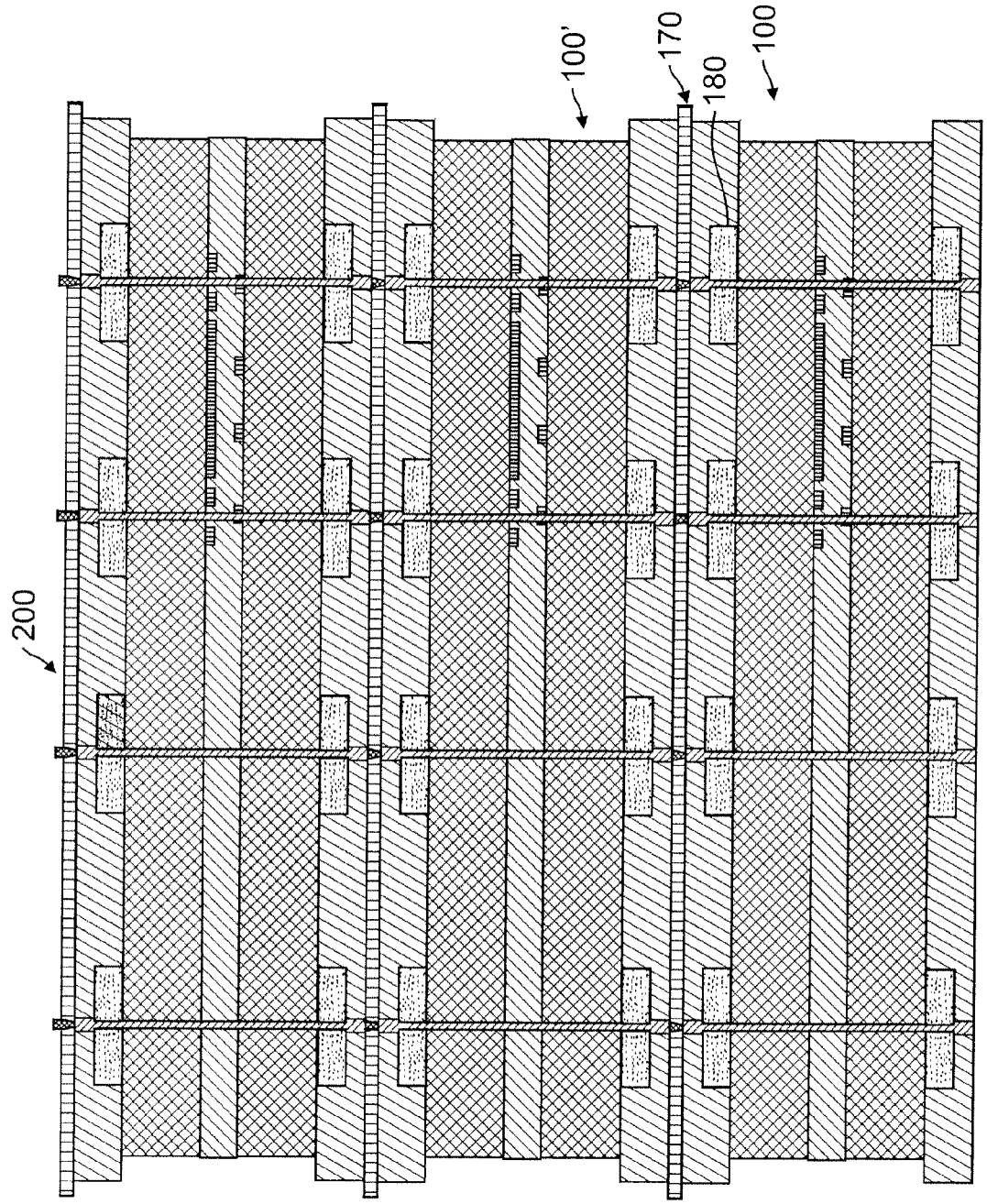
FIG. 2 represents three (3) sub-assemblies (subs) put together according to an embodiment of the present invention.
Figure 3:
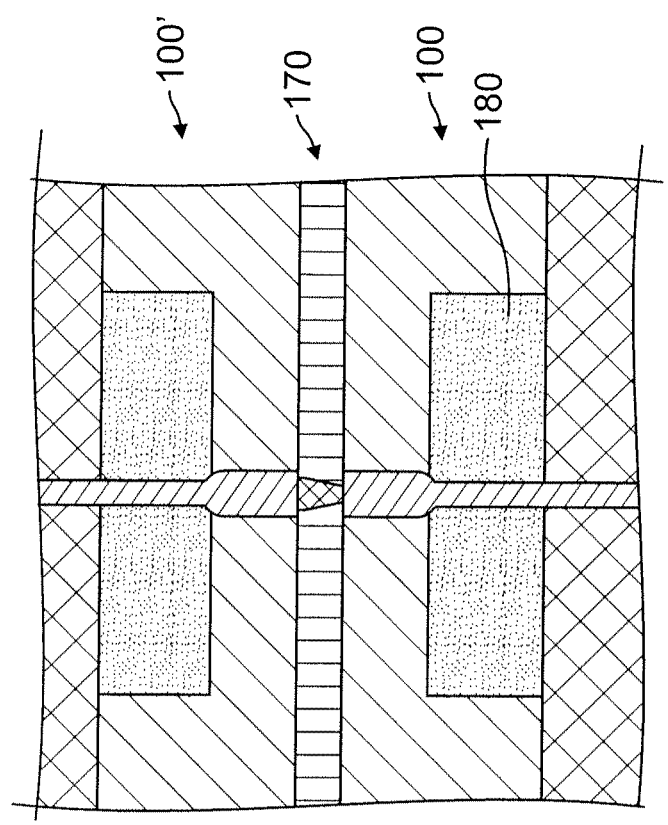
FIG. 3 is a detailed view of the ink joint showing the wrap that is relatively "flat" on each of the two subs of FIG. 2.

Finally, as shown in FIGS. 1C, 2 and 3, a final printed circuit board (or a final sub-assembly) 200 is formed by removing the protective film (see FIG. 1C) for lay-up and lamination with a second sub-assembly 100' (see FIGS. 2 and 3). That is, as shown in FIGS. 2 and 3, the second sub-assembly 100' is placed such that the lamination adhesive 170 is between the two sub-assemblies 100 and 100' and then cured to form the final printed circuit board 200 (see FIG. 2). Here, the final printed circuit board 200 is formed such that each of the vias 160 also corresponds in position to at least one of a plurality of copper foil pads (i.e., the Etched conducts shown in FIG. 1A) 180 located in the first sub-assembly 100. Also, in one embodiment, the second sub-assembly 100' is formed in a method substantially similar to the method for forming the first sub-assembly 100.

Here, the printed circuit board 200 shown in FIG. 2 includes a plurality of circuit layers. The conductive paste in the vias 160 and the metal material 140 in the countersinks 130 and the holes 110 electrically interconnect the plurality of copper foil pads 180 located in the first sub-assembly 100 to a plurality copper of foil pads (e.g., Etched conductors) located in the second sub-assembly 100'.

As such and in view of the above, a printed circuit board with Z-axis interconnects (e.g., the holes 110, the countersinks 130, and/or micro vias 160) are provided that can eliminate a need for plating micro vias and/or eliminate a need for planarizing plated bumps of a surface, that can be fabricated with one or two lamination cycles, and/or that can have carrier-to-carrier (or sub-to-sub) attachments with conductive vias, each filled with a conductive material (e.g., with a conductive paste) in the Z-axis.

Also, in one embodiment, the metal material (or metal) 140 in the at least one of the holes 110 is securely anchored with the at least one hole 110 by the metal material (or metal) 140 in the corresponding one of the countersinks 130.

In one embodiment and as shown in FIG. 3, the countersink 130 of the first sub-assembly 100 is configured to face and increase a contact surface area with another corresponding counter sink of the second sub-assembly 100'.

In one embodiment, the first and second sub-assemblies 100 and 100' are attached by aligning the first and second of sub-assemblies 100 and 100' to each other; and curing the lamination adhesive 170 on the first sub-assembly 100 to laminate the first and second of sub-assemblies with each other 100 and 100'.

That is, in view of the foregoing, the attaching of the plurality of sub-assemblies may include: aligning at least one countersink 130 and at least another countersink 130 to face and be electrically coupled to each other through at least one via 160 filled with the conductive paste; and curing the lamination adhesive 170 on at least one of the plurality of sub-assemblies (e.g., the first sub-assembly 100) to laminate the at least one of the plurality of sub-assembles to another one of the plurality of sub-assemblies (e.g., the second sub-assembly 100').

In one embodiment, each of the plurality of sub-assemblies forming the circuit board 200 includes a substrate, at least one foil pad (or copper foil pad) on the substrate, and a prepreg on the substrate and covering the at least one foil pad, wherein at least one of the holes 110 is formed by drilling the at least one hole to correspond in position to the at least one foil pad, and at least one of the countersinks is formed by drilling the at least one counter sink to correspond in position to the at least one foil pad. In one embodiment, the drilling of the at least one hole 110 includes drilling the at least one hole 110 entirely through both the prepreg and the at least one foil pad, and the drilling of the at least one countersink 130 includes drilling the at least one countersink 130 at least partially though the prepreg and only partially though the at least one foil pad. In one embodiment, the drilling of the at least one hole 110 includes drilling the at least one hole 110 at least partially through the prepreg, the at least one foil pad and the substrate, and the drilling of the at least one countersink 130 includes drilling the at least one countersink 130 at least partially though the prepreg.

Figure 4A:
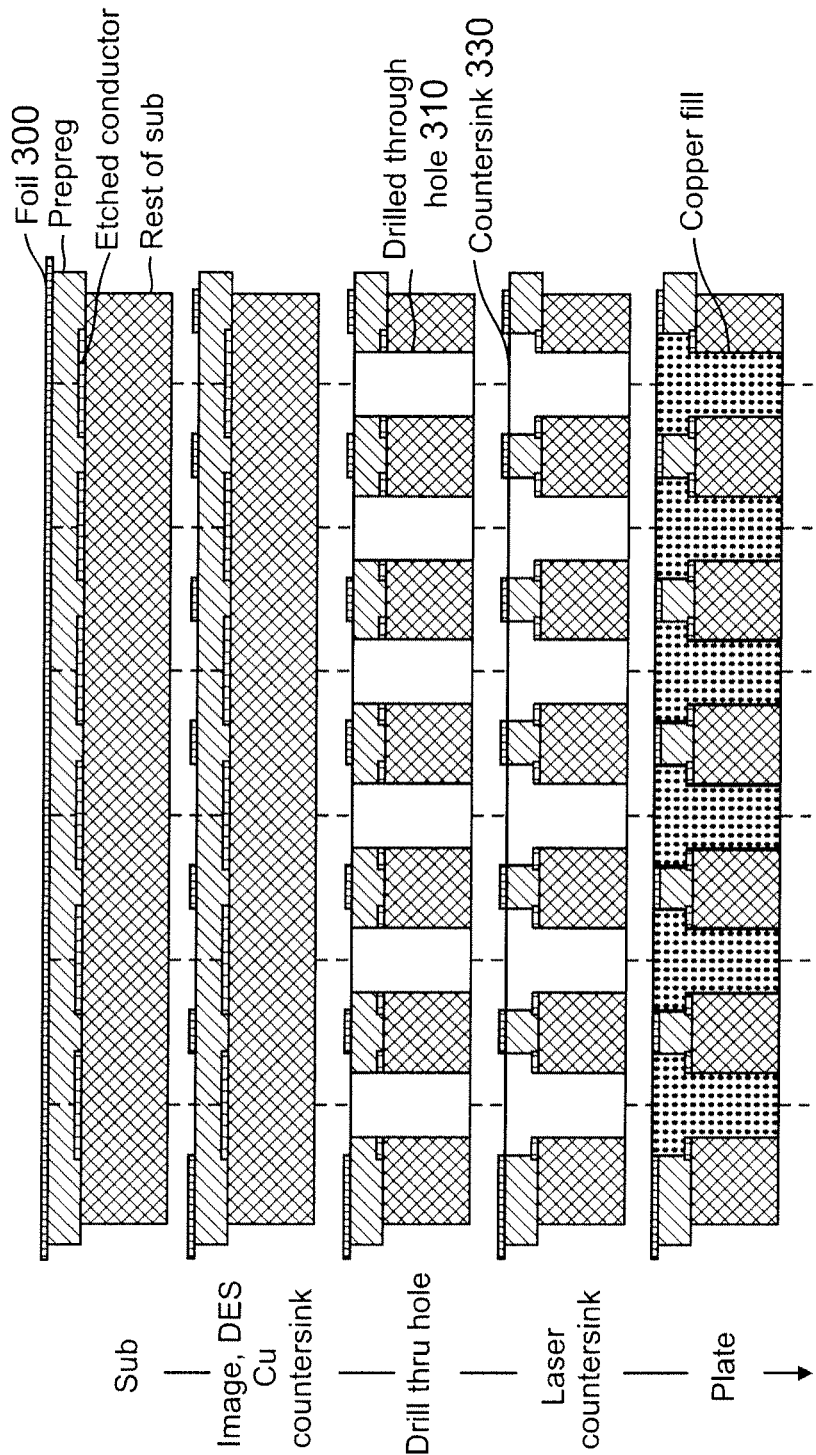
FIGS. 4A and 4B illustrate a laser countersink version of wrap that is made to be relatively "flat" for the sub-assembly (sub) to sub-assembly (sub) attach according to an embodiment of the present invention.
Figure 4B:
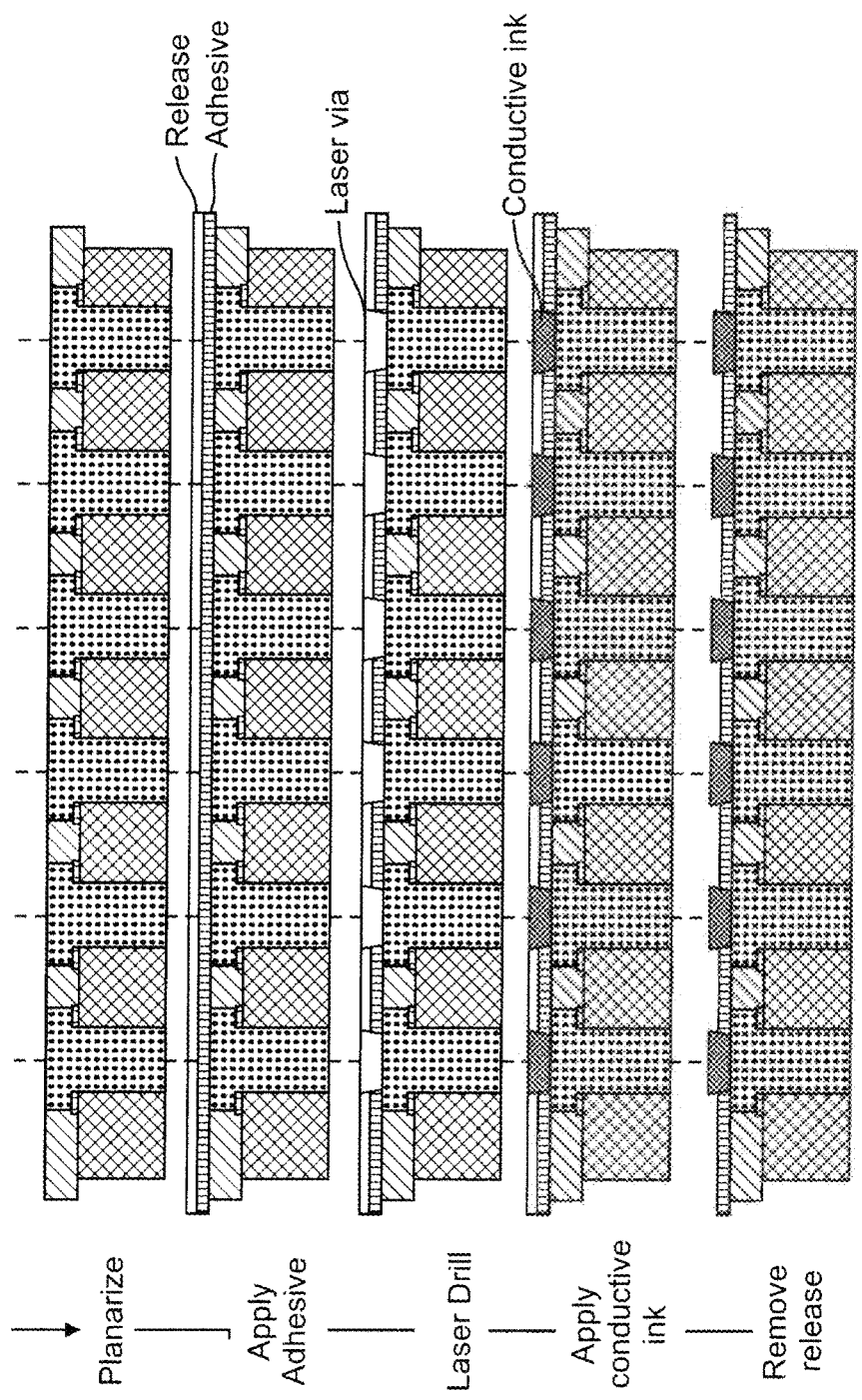

As shown, FIG. 2 represents three (3) subs put together as above described, i.e., attached with ink joint at PTH. FIG. 3 is a detailed view of the ink joint showing the wrap that is relatively "flat" on each of the two subs. FIGS. 4A and 4B illustrate a laser countersink version of wrap that is made to be relatively "flat" for the sub to sub attach.

Here, in FIGS. 1A, 1B and 1C, the countersink according to an embodiment of the present invention is shown to be formed mechanically, but the present invention is not thereby limited. In another embodiment and referring to FIGS. 4A and 4B, for example, the countersink could be formed by imaging an opening around the thru hole and removing the surrounding material with a laser. That is, as shown in FIGS. 4A and 4B, in one embodiment of the present invention, prior to drilling of at least one hole 310, the method further includes: laminating a solid metal foil layer (Foil) 300 on the first side of at least one of the plurality of sub-assemblies as an outermost layer of the at least one of the plurality of sub-assemblies; and selectively removing a portion of the solid metal foil layer 300 to form a clearance at a position corresponding to the at least one hole 310 and at least one corresponding countersink 330. The forming of the at least one hole 310 may include drilling the at least one hole 310 at the clearance, and the forming of the at least one countersink 330 may include drilling the at least one countersink 330 at the clearance. The selectively removing of the portion of the solid metal foil layer 300 to form the clearance may include selectively removing of the portion of the solid metal foil layer 300 to form the clearance to have a diameter substantially identical to the diameter of the at least one corresponding countersink 330. If a $CO_2$ laser is used, then the copper foil pad (or Etched conductor) shown, e.g., 180 in FIGS. 1A, 2 and 3 will stop further penetration. This may be desirable with smaller diameter holes, holes with non-round countersink, thinner foils for the underlying pads. The embodiment in FIGS. 1A, 1B, 1C, 2 and 3 utilized 2 oz copper, but it could be very thin or even thicker than 2 oz.

Referring to FIGS. 2 and 3, three subs could be prepared that are about 60 mils thick. The drilled vias could be about 6 mils in diameter. The countersink might be about 10 mils in diameter. Capture pads within each sub could be about 10 mils. Antipads in the laminate might be about 12 mils in diameter. Each sub with one or more printed through holes (PTHs) would have an aspect ratio of about 10:1. These geometries are manufacturable for each sub. If three subs are attached to make one board of about 180 mils thick, then the overall aspect ratio is about 30:1. Particularly at about 6 mil holes, it is difficult to drill through about 180 mils. If the board can be drilled, then it is very difficult to first metalize a seedlayer on the inside of the hole and second to plate the seed layer in a PTH process.

High aspect ratio holes such as these are desired and/or necessary for chip testing applications known as probe and load cards. The small diameter holes match the pitch requirements of the tester. The associated high layer counts make these applications very difficult. A comparative process requires precision drilling from both surfaces and forced pumping of the electroless and electrolytic solutions through the holes to prepare the PTH. The comparative process suffers from drill wander and poor yields.

In view of the foregoing, and according to embodiments of the present invention, the primary enhancements of building multilayer boards using parallel build techniques are the following:

1. Sequential build boards have several times as many opportunities to scrap prior steps.

2. Parallel build has fewer steps to make a board allowing the board to be produced multiple times faster.

3. Faster production of boards improves the learning cycle time for the customer when prototypes are produced.

4. Faster production times allow board production on customer demand with less product sitting on the shelf at the fabrication, assembly, and customer sites.

5. Since there are fewer steps the overall process produces less scrap and higher quality than a sequential build even though similar equipment and processes are used to produce the board.

6. Overall capacity for an equipment set to produce a board is increased.

7. Possible to make hybrid material sets with otherwise incompatible materials

8. Possible to incorporate specialized layers into the board.

9. Use of countersink technique produces landing pads for sub to sub ink joints. The metal (or copper) wrap that is flushed with the resin/glass composite can be prepared with a countersink technique, i.e., with countersink mechanical drilling or with a combination mechanical drill and laser countersink. This countersink technique produces a more reliable inner sub plated thru hole which produces less bending stress on layers burying the sub than with conventional plated wrap techniques. Overall using the countersink technique as described above according to an embodiment of the present invention results in very high aspect ratio holes and the resulting layer to layer circuit density that is higher than can be done conventionally.

While the invention has been described in connection with certain exemplary embodiments, it is to be understood by those skilled in the art that the invention is not limited to the disclosed embodiments, but, on the contrary, is intended to cover various modifications included within the spirit and scope of the present invention, and equivalents thereof.

What is claimed is:

1. A method of manufacturing at least a portion of a printed circuit board, the method comprising:
   attaching a plurality of sub-assemblies with each other after processing at least one of the plurality of sub-assemblies, wherein each of the plurality of sub-assemblies comprises a plurality of circuit layers, and the processing of the at least one of the plurality of sub-assemblies comprises:
   forming at least one hole having a first diameter and a first depth from a first side of the at least one of the plurality of sub-assemblies and into the at least one of the plurality of sub-assemblies;
   forming at least one countersink having a second diameter larger than the first diameter and a second depth shorter than the first depth from the first side of the at least one of the plurality of sub-assemblies and into the at least one of the plurality of sub-assemblies at the at least one hole;
   metalizing the at least one hole and the at least one countersink to metalize the at least one hole and the at least one countersink;
   applying a lamination adhesive layer on the first side of the at least one of the plurality of sub-assemblies;
   applying a protective film on the lamination adhesive layer;
   forming at least one via into the lamination adhesive layer to expose a metalized portion of the at least one countersink;
   filling at least one conductive paste into the at least one via formed in the lamination adhesive layer; and
   removing the protective film to expose the lamination adhesive layer on the at least one of the plurality of sub-assemblies for attachment with the other plurality of sub-assemblies.

2. The method of claim 1, wherein the metalizing of the at least one hole and the at least one countersink comprises electrolytic plating the at least one hole and the at least one countersink to plate close the at least one hole and the at least one countersink.

3. The method of claim 2, wherein the electrolytic plating of the at least one hole and the at least one countersink comprises electrolytic copper plating the at least one hole and the at least one countersink to plate close the at least one hole and the at least one countersink with copper.

4. The method of claim 1, wherein the attaching of the plurality of sub-assemblies comprises:
   aligning the plurality of sub-assemblies to each other; and
   curing the lamination adhesive layer on the at least one of the plurality of sub-assemblies to laminate the plurality of sub-assemblies with each other.

5. The method of claim 1, wherein the at least one of the plurality of sub-assemblies comprises a substrate, at least one foil pad on the substrate, and a prepreg on the substrate and covering the at least one foil pad, wherein the forming of the at least one hole comprises drilling the at least one hole to correspond in position to the at least one foil pad, and wherein the forming of the at least one countersink comprises drilling the at least one countersink to correspond in position to the at least one foil pad.

6. The method of claim 5, wherein the drilling of the at least one hole comprises drilling the at least one hole entirely through both the prepreg and the at least one foil pad, and wherein the drilling of the at least one countersink comprises drilling the at least one countersink at least partially though the prepreg and only partially though the at least one foil pad.

7. The method of claim 5, wherein the drilling of the at least one hole comprises drilling the at least one hole at least partially through the prepreg, the at least one foil pad and the substrate, and wherein the drilling of the at least one countersink comprises drilling the at least one countersink at least partially though the prepreg.

8. The method of claim 1, wherein, prior to drilling of the at least one hole, the method further comprises:
   laminating a solid metal foil layer on the first side of the at least one of the plurality of sub-assemblies as an outermost layer of the at least one of the plurality of sub-assemblies; and
   selectively removing a portion of the solid metal foil layer to form a clearance at a position corresponding to the at least one hole and the at least one countersink.

9. The method of claim 8, wherein the forming of the at least one hole comprises drilling the at least one hole at the clearance, and wherein the forming of the at least one countersink comprises drilling the at least one countersink at the clearance.

10. The method of claim 9, wherein the selectively removing of the portion of the solid metal foil layer to form the clearance comprises selectively removing of the portion of the solid metal foil layer to form the clearance to have a third diameter substantially identical to the second diameter.

11. The method of claim 1, further comprising:
forming at least another hole having substantially the first diameter and the first depth from a second side of the at least another one of the plurality of sub-assemblies and into the at least another one of the plurality of sub-assemblies;
   forming at least another countersink having substantially the second diameter and the second depth from the second side of the at least another one of the plurality of sub-assemblies and into the at least another one of the plurality of sub assemblies at the at least another hole; and
   metalizing the at least another hole and the at least another countersink to metalize the at least another hole and the at least another countersink.

12. The method of claim 11, wherein the attaching of the plurality of sub-assemblies comprises:
   aligning the at least one countersink and the at least another countersink to face and be electrically coupled to each other through the at least one via filled with the conductive paste; and
   curing the lamination adhesive layer on the at least one of the plurality of sub-assemblies to laminate the at least one of the plurality of sub-assemblies to the at least another one of the plurality of sub-assemblies.

13. The method of claim 1, wherein the first diameter is about 6 mils, and the second diameter is about 10 mils.

14. The method of claim 1, wherein the at least one countersink is formed by laser drilling, and wherein the at least one hole is formed by mechanical drilling.

15. The method of claim 14, wherein the at least one via is formed by laser drilling.

16. The method of claim 1, wherein the at least one countersink is formed by drilling, wherein the at least one hole is formed by drilling, and wherein the at least one via is formed by drilling.

17. A method of manufacturing at least a portion of a printed circuit board, the method comprising:
   attaching a plurality of sub-assemblies with each other after processing at least one of the plurality of sub-assemblies, wherein each of the plurality of sub assemblies comprises a plurality of circuit layers and the processing of the at least one of the plurality of sub-assemblies comprises:
   forming at least one countersink having a first diameter and a first depth from a first side of the at least one of the plurality of sub-assemblies and into the at least one of the plurality of sub-assemblies;
   forming at least one hole having a second diameter smaller than the first diameter and a second depth longer than the first depth from the first side of the at least one of the plurality of sub-assemblies and into the at least one of the plurality of sub-assemblies at the at least one countersink;
metalizing the at least one hole and the at least one countersink to metalize the at least one hole and the at least one countersink;
   applying a lamination adhesive layer on the first side of the at least one of the plurality of sub-assemblies;
   applying a protective film on the lamination adhesive layer;
   forming at least one via into the lamination adhesive layer to expose a metalized
   portion of the at least one countersink;
   filling at least one conductive paste into the at least one via formed in the lamination adhesive layer; and
   removing the protective film to expose the lamination adhesive layer on the at least one of the plurality of sub-assemblies for attachment with the other plurality of sub-assemblies.

* * * * *